US006815755B2

(12) United States Patent
Colclaser et al.

(10) Patent No.: US 6,815,755 B2
(45) Date of Patent: Nov. 9, 2004

(54) NON-VOLATILE MEMORY CELLS, HIGH VOLTAGE TRANSISTORS AND LOGIC TRANSISTORS INTEGRATED ON A SINGLE CHIP

(75) Inventors: Roy Arthur Colclaser, Albuquerque, NM (US); Guido Jozef Maria Dormans, Nijmegen (NL); Donald Robert Wolters, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/390,946

(22) Filed: Mar. 18, 2003

(65) Prior Publication Data

US 2003/0168694 A1 Sep. 11, 2003

Related U.S. Application Data

(62) Division of application No. 09/746,028, filed on Dec. 21, 2000, now abandoned.

(30) Foreign Application Priority Data

Dec. 21, 1999 (EP) ............................................ 99204452

(51) Int. Cl.[7] .............................................. H01L 29/76
(52) U.S. Cl. ..................................... 257/314; 438/201
(58) Field of Search ................................ 257/314–318, 257/319–326; 438/257–258, 266, 242, 201

(56) References Cited

U.S. PATENT DOCUMENTS

| 4,471,373 A | * | 9/1984 | Shimizu et al. | 257/315 |
| 5,101,248 A | * | 3/1992 | Takebuchi | 257/314 |
| 5,674,762 A | * | 10/1997 | See et al. | 438/234 |
| 5,731,238 A | * | 3/1998 | Cavins et al. | 438/261 |

(List continued on next page.)

*Primary Examiner*—Long Pham
*Assistant Examiner*—Thao X. Le
(74) *Attorney, Agent, or Firm*—Peter Zawilski

(57) ABSTRACT

Semiconductor device having on a single substrate (1) at least one memory cell (3) and at least one logic transistor (25);

the at least one memory cell having a floating gate (5), a tunnel oxide layer (11) between the floating gate and the substrate (1), a control gate (15), and a control oxide layer (13) between the control gate (15) and the floating gate (5);

the at least one logic transistor (25) having a logic transistor gate (5', 15") and a logic transistor gate oxide (11") between the logic transistor gate (5', 15") and the substrate (1), the tunnel oxide layer (11) of the memory cell (3) and the logic transistor gate oxide (11") having a same or substantially same predetermined first thickness. The invention also relates to a method of manufacturing such a device and to such a device that also comprises a high voltage transistor (17) which is optionally made so as to be an integral part of at least the memory cell (3).

7 Claims, 3 Drawing Sheets

U.S. PATENT DOCUMENTS

| | | | |
|---|---|---|---|
| 5,792,670 A * | 8/1998 | Pio et al. | 438/257 |
| 5,904,518 A * | 5/1999 | Komori et al. | 438/201 |
| 5,907,171 A * | 5/1999 | Santin et al. | 257/315 |
| 6,037,625 A * | 3/2000 | Matsubara et al. | 257/315 |
| 6,087,211 A * | 7/2000 | Kalnitsky et al. | 438/232 |
| 6,177,703 B1 * | 1/2001 | Cunningham | 257/321 |
| 6,194,270 B1 * | 2/2001 | Bottini et al. | 438/258 |
| 6,194,279 B1 * | 2/2001 | Chen et al. | 438/303 |
| 6,197,635 B1 * | 3/2001 | Hsaio et al. | 438/257 |
| 6,251,728 B1 * | 6/2001 | Patelmo et al. | 438/257 |
| 6,268,247 B1 * | 7/2001 | Cremonesi et al. | 438/258 |
| 6,281,077 B1 * | 8/2001 | Patelmo et al. | 438/258 |
| 6,287,907 B1 * | 9/2001 | Ito et al. | 438/201 |
| 6,297,103 B1 * | 10/2001 | Ahn et al. | 438/275 |
| 6,329,254 B1 * | 12/2001 | Cremonesi et al. | 438/289 |
| 6,346,442 B1 * | 2/2002 | Aloni et al. | 438/258 |
| 6,348,378 B1 * | 2/2002 | Lee | 438/257 |
| 6,351,008 B1 * | 2/2002 | Patelmo et al. | 257/315 |
| 6,376,879 B2 * | 4/2002 | Mori et al. | 257/347 |
| 6,399,442 B1 * | 6/2002 | Baldi et al. | 438/258 |
| 6,420,223 B2 * | 7/2002 | Camerlenghi | 438/211 |
| 6,524,914 B1 * | 2/2003 | He et al. | 438/264 |

* cited by examiner

NON-VOLATILE MEMORY CELLS, HIGH VOLTAGE TRANSISTORS AND LOGIC TRANSISTORS INTEGRATED ON A SINGLE CHIP

This is a divisional of application Ser. No. 09/746,028, filed Dec. 21, 2000 now abandoned.

The present invention relates to non-volatile memory cells integrated on a chip with logic transistors and/or high voltage transistors.

One of the most serious limiting factors in scaling the tunnel oxide in floating gate non-volatile memory cells is stress-induced leakage current (SILC). For oxides thinner than 8 nm the ability to store charge on the floating gate of a memory cell becomes questionable. It has been demonstrated that the characteristics of the tunnel oxide change as a result of passing charge through the oxide. Program/erase cycles weaken the ability of the oxide to isolate the floating gate from a substrate. Some believe that non-volatile memory oxide scaling much below 8 nm is difficult and perhaps impossible unless the 10-year charge retention requirement for non-volatile memory cells is relaxed. Some have even suggested that "non-volatile" memories may have to be "refreshed" periodically like DRAMs, but not nearly as frequently, in order not to lose the data stored. This may be a viable solution for some applications, however, the concept of "non-volatile" changes to "not-so-much-volatile". Besides, "refreshing" may lead to failure. One application that could have problems with this approach is the "smart-card", which could lose vital information if refreshing does not occur, and these cards are often not connected to a power supply for long periods of time.

If the tunnel oxide is limited to 8 nm, or a higher value, it will be difficult to make a cost-effective, non-volatile memory module embedded in an advanced CMOS logic process. In such a process, floating gate non-volatile memory cells are manufactured on the same substrate as logic CMOS transistors. The gate oxide thicknesses of the CMOS logic transistors are typically in the order of 5 nm or less.

Assuming that Folwer-Nordhein tunneling is used for at least one of the programming or erasing procedures, the thickness of the tunnel oxide in the memory cell, in combination with the coupling ratio of the control gate to the floating gate, determines the voltage necessary for the efficient transfer of charge to and/or from the floating gate. In particular, a tunnel oxide in the range from 8 to 9 nm will usually require a voltage of such high level that it is necessary to include high voltage transistors on the substrate for controlling this high voltage. The gate oxide of these high voltage transistors must be much thicker than the tunnel oxide of the memory cells: typically, 15 to 25 nm is used.

Moreover, there is an insulating layer between the control gate and the floating gate of the memory cell, which is typically made of oxide-nitride-oxide (ONO).

Therefore, in a process in which floating gate memory cells, logic transistors and high voltage transistors must be made on the same substrate there are typically at least the following four oxide/insulating layers:
the tunnel oxide of the memory cell;
the gate oxide of the high voltage transistor;
the gate oxide of the logic transistor; and
the insulating layer between the control gate and the floating gate of the memory cell.

Until now these oxide-insulating layers were provided in different thicknesses, thereby adding to the costs of the process and introducing reliability risks.

H. Watanabe, e.a., "Scaling of Tunnel Oxide Thickness for Flash EEPROMs Realizing Stress-Induced Leakage current Reduction", 1994 Symposium on VLSI Technology Digest of Technical Papers, 1994, pp. 47–48, discloses a method for reducing stress-induced leakage current (SILC) in floating gate non-volatile memory cells. One of the measures taken is to lower the floating gate impurity concentration. As a result, the SILC level is reduced to such a level that the thickness of the tunnel oxide below the floating gate can be reduced to about 6 nm. In order to prevent an increase of the programming voltage to due to the lowered impurity concentration, it is proposed to apply an impurity concentration of 5 to $7 \times 10^{19}$ cm$^{-3}$.

T. Kubota, e.a., "The Effect of the Floating Gate/Tunnel SiO$_2$ Interface on FLASH Memory Data Retention Reliability", NEC Research & Development, Vol. 38, 1997, No. 4, pp. 412–418, state that the data retention time of a floating gate memory cell will be enhanced by lowering the impurity concentration since this will lower the SILC level.

By using the proposals made by Watanabe, e.a., and Kubota, e.a., it would be possible to scale the thickness of the tunnel oxide similarly as the process scales for the next generation. It is envisaged that gate oxides having thicknesses in the order of 2 to 5 nm will be used.

By making cells with a thin, very lightly doped polysilicon floating gate, it is possible to make such thin tunnel oxides and still have an acceptable level of SILC.

The object of the present invention is to provide a simplified method of manufacturing on a single substrate at least one memory cell and at least one logic transistor.

In order to achieve this object, the present invention claims a method of manufacturing on a single substrate at least one memory cell and at least one logic transistor;
the at least one memory cell comprising a floating gate, a tunnel oxide layer between the floating gate and the substrate, a control gate, and a control oxide layer between the control gate and the floating gate;
the at least one logic transistor comprising a logic transistor gate and a logic transistor gate oxide between the logic transistor gate and the substrate, characterized in that the tunnel oxide layer of the memory cell and the logic transistor gate oxide are made in a same step and have a same or substantially same predetermined first thickness.

Since it is possible to control the SILC level by choosing a proper impurity concentration of the non-volatile memory floating gate, the tunnel oxide layer thickness of the memory cell can be designed such that it is equal to the thickness of the logic transistor gate oxide. Thus, they can be made in the same step of the process, which reduces costs and enhances reliability.

A similar approach can be used to simplify the process of integrating floating gate memory cells and the high voltage transistors needed for the programming and deprogramming of the memory cells on the same substrate. Therefore, the invention also relates to a method of manufacturing on a single substrate at least one memory cell and at least one high voltage transistor;
the at least one memory cell comprising a floating gate, a tunnel oxide layer between the floating gate and the substrate, a control gate, and a control oxide layer between the control gate and the floating gate;
the at least one high voltage transistor comprising a high voltage transistor gate and a high voltage transistor gate oxide between the high voltage transistor gate and the substrate,
characterized in that the high voltage transistor gate oxide comprises a first gate oxide layer on top of the substrate and a second gate oxide layer on top of the first gate oxide layer, in that the first gate oxide layer and the tunnel oxide layer of the memory cell are made in a same first step and have a same or substantially same predetermined first thickness,
and in that the second gate oxide layer and the control oxide layer of the memory cell are made in a same second step and have a same or substantially same predetermined second thickness.

By splitting up the gate oxide of the high voltage transistor into a first gate oxide layer and a second gate oxide layer, with the first gate oxide layer thickness being made in the same manufacturing step as the tunnel oxide of the memory cell and the second gate oxide layer being made in the same manufacturing step as the insulating layer between the control gate and the floating gate of the memory cell, a more cost-effective and more reliable process is obtained. Then, both the thicknesses of the tunnel oxide, the insulating layer between the control gate and the floating gate in the memory cell and the gate oxide of the high voltage transistor can be designed in accordance with any requirement because the doping concentration of the floating gate of the memory cells can be selected so as to be low enough to provide the required freedom of design.

These processes can also be integrated in order to have memory cells, logic transistors and high voltage transistors integrated on one single substrate in accordance with the invention.

Then, instead of four different oxide/insulating layers there are only two: a first oxide layer directly on the substrate, that is used as a tunnel oxide in the memory cell, as a gate oxide in the logic transistor, and as the first gate oxide layer in the high voltage transistor, and a second oxide layer which is used as an insulating layer between the control gate and the floating gate of the memory cell and as a second gate oxide layer in the high voltage transistor. It is evident that such an integrated process is cheaper than the process in accordance with the prior art because fewer masks are needed and fewer process steps are required.

The thickness of the tunnel oxide, the first gate oxide layer and the gate oxide layer of the logic transistor is preferably in the range between 2 and 10 nm, even more preferably between 4 and 8 nm.

The doping concentration of the floating gate is preferably less than $1 \times 10^{20}$ per cm$^3$, preferably less than $4 \times 10^{19}$ cm$^{-3}$.

A further advantage can be obtained if the logic gate transistor comprises a first gate layer on top of the logic transistor gate oxide and a second gate layer on top of the first gate layer. The first gate layer and the floating gate are preferably made simultaneously and have the same or substantially same predetermined third thickness and the same or substantially same predetermined doping concentration.

The second gate layer of the logic transistor is preferably made in the same manufacturing step as, if applicable, the gate of the high voltage transistor.

The present invention does not only relate to a method but also to a semiconductor device comprising on a single substrate at least one memory cell and at least one logic transistor;
the at least one memory cell comprising a floating gate, a tunnel oxide layer between the floating gate and the substrate, a control gate, and a control oxide layer between the control gate and the floating gate;
the at least one logic transistor comprising a logic transistor gate and a logic transistor gate oxide between the logic transistor gate and the substrate, characterized in that the tunnel oxide layer of the memory cell and the logic transistor gate oxide have a same or substantially same predetermined first thickness.

In a further embodiment the present invention also relates to a semiconductor device comprising on a single substrate at least one memory cell and at least one high voltage transistor;
the at least one memory cell comprising a floating gate, a tunnel oxide layer between the floating gate and the substrate, a control gate, and an a control oxide layer between the control gate and the floating gate;
the at least one high voltage transistor comprising a high voltage transistor gate and a high voltage transistor gate oxide between the high voltage transistor gate and the substrate,
characterized in that the high voltage transistor gate oxide comprises a first gate oxide layer on top of the substrate and a second gate oxide layer on top of the first gate oxide layer,
in that the first gate oxide layer and the tunnel oxide layer of the memory cell have a same or substantially same predetermined first thickness, and in that the second gate oxide layer and the control oxide layer of the memory cell have a same or substantially same predetermined second thickness.

Hereinafter, the present invention will be illustrated with reference to some drawings, which are intended for illustration purposes only and do not limit the scope of the present invention, which is defined only by the annexed claims.

Figure 1:
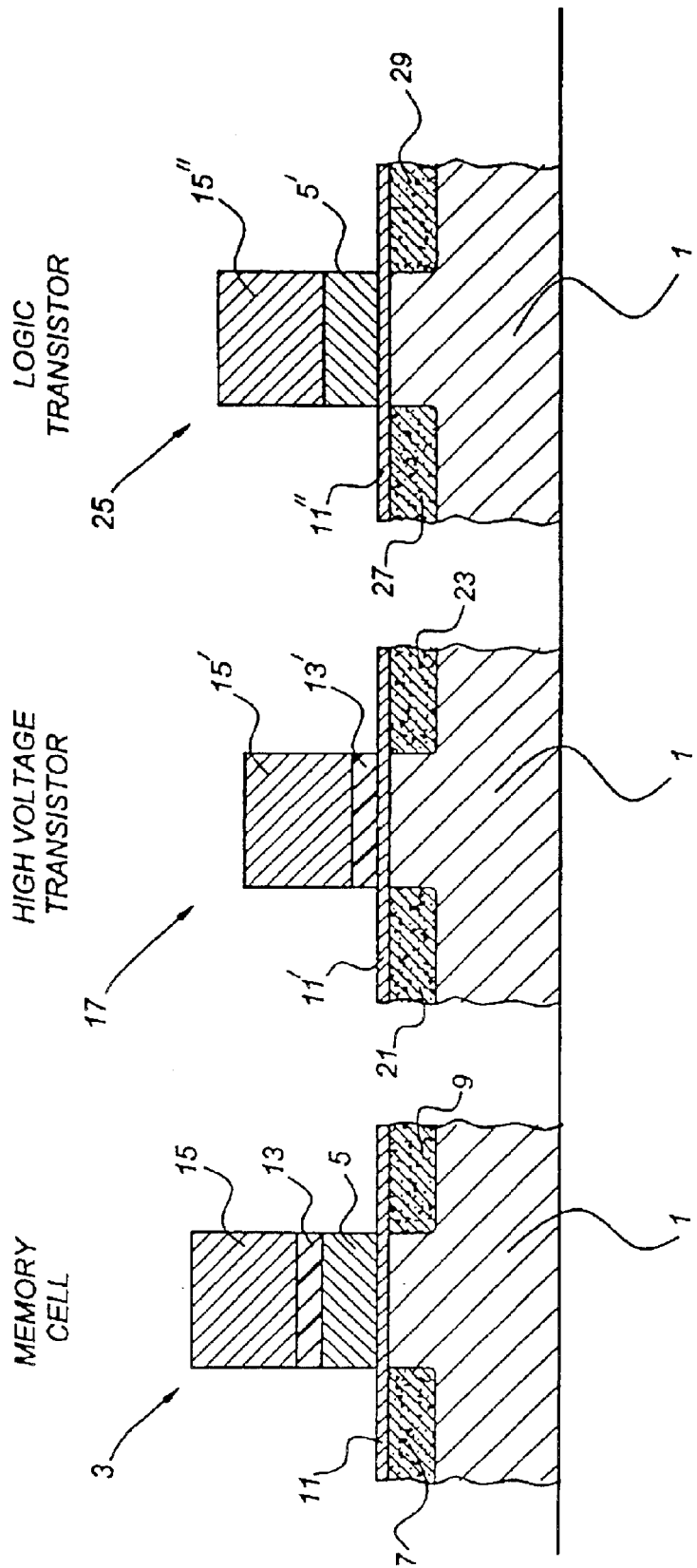
FIG. 1 shows, in a very schematical way and not drawn to scale, a floating gate memory cell, a high voltage transistor, and a logic transistor on a single substrate.

In the figure, the memory cell 3 comprises a floating gate 5 that is separated from the substrate 1 by a tunnel oxide 11. A source 7 and a drain 9 may be made in the substrate for programming and deprogramming actions, as is known to persons skilled in the art. The memory cell 3 also comprises a control gate 15 that is separated from the floating gate 5 by an insulating layer 13. The insulating layer 13 may be made of oxide-nitride-oxide as is known to persons skilled in the art. However, in accordance with one embodiment of the present invention, the insulating layer 13 is preferably made of a $SiO_2$ layer only.

A high voltage transistor 17, required for the writing and erasing functions of the memory cell 3, is also provided on the same substrate 1.

The high voltage transistor 17 comprises a gate 15' on top of a gate oxide. The gate oxide, in accordance with the present invention, comprises two layers: a first gate oxide layer 11' and a second gate oxide layer 13' on top of the first gate oxide layer 11'. The first gate oxide layer 11' contacts the substrate 1. A source 21 and a drain 23 are provided in the substrate, as is known to persons skilled in the art.

A logic transistor 25, which forms part of one or more logical circuits, is also provided on the substrate 1. The logic transistor comprises a gate which, in accordance with one embodiment of the present invention, comprises two layers: a first gate 5' and a second gate 15".

The logic transistor 25 also comprises a gate oxide 11" between the gate 5', 15", and the substrate 1.

A source 27 and a drain 29 are provided in the usual way.

In accordance with the invention, the doping concentration of the floating gate 5 can be chosen to be so low that the thickness of the tunnel oxide 11 equals the thickness of the gate oxide 11" of the logic transistor 25, and that the SILC level of the memory cell 3 is still o low that the charge retention requirement, e.g. 10-years, of the memory cell can still be met. Because the thickness of the tunnel oxide 11 equals the thickness of the gate oxide 11", they can be made in the same manufacturing step, which reduces costs and enhances reliability.

In accordance with a further embodiment of the present invention, the first gate oxide layer 11' of the high voltage transistor 17 has the same or substantially same thickness as the tunnel oxide 11 of the memory cell 3. Therefore, in this embodiment the first gate oxide layer 11' of the high voltage transistor 17, be made in the same manufacturing step as the tunnel oxide 11 of the memory cell 3. In a process in which a memory cell 3, the high voltage transistor 17, as well as a logic transistor 25 are made on the same single substrate 1, the tunnel oxide 11, the first gate oxide 11', and the gate oxide 11" can have equal thicknesses and be made in the same manufacturing step.

Since the total thickness of the gate oxide 11', 13' of the high voltage transistor 17 must be greater than the thickness of the tunnel oxide 11 of the memory cell 3, the second gate oxide layer 13' of the high voltage transistor 17 must be designed such that the requirements can be met. Preferably, the insulating layer 13 between the control gate 15 and the floating gate 5 is also made of $SiO_2$ and has the same or substantially same thickness as the second gate oxide layer 13' of the high voltage transistor 17. Then, these two layers 13, 13' can be made in a single manufacturing step, thereby further reducing costs and enhancing reliability.

The thickness of the oxide layer 11, 11', 11" is preferably in the range between 2 and 10 nm, and more preferably is a range between 4 and 8 nm. In this latter range, the value of the switching voltage of the logic transistor 25 is preferably between 1.5 and 3.5 V, and will typically be 2.5 V.

The switching voltage of the high voltage transistor 17 is preferably in the range of 15–20 V. This requires a total thickness of the gate oxide layers 11', 13' of 15–30 nm.

The floating gate 5 may be either n-type, e.g., made by implanting P or As atoms, or p-type, e.g., made by implanting B or In atoms. The doping concentration of the floating gate 5 is preferably less than $1\times10^{20}$ per $cm^3$, and more preferably less than $4\times10^{19}$ per $cm^3$.

In a further embodiment, the gate of the logic transistor 25 has two layers 5' and 15" which are also necessary in other parts of the process. The first gate layer 5' is preferably manufactured in the same step as the floating gate 5 of the memory cell 3 and made of the same material with the same doping characteristics and in the same or substantially same thickness.

The second gate layer 15" is preferably made in the same manufacturing step as the control gate 15 of the memory cell 3 and the gate 15' of the high voltage transistor 17.

By providing the gate of logic gate transistor 25 with two such layers 5', 15", the following advantages are obtained. The floating gate 5 is thinner than the logic gate 5', 15", which reduces the topology in the memory map and simplifies the manufacturing process. Another advantage of a thinner floating gate 5 is that the grain size of the polysilicon in the gate is related to the floating gate thickness. The thinner the floating gate 5, the smaller the grain size will be, while gates with smaller grains have the advantage of better programming and deprogramming properties. Moreover, they potentially have a higher reliability.

Figure 2:
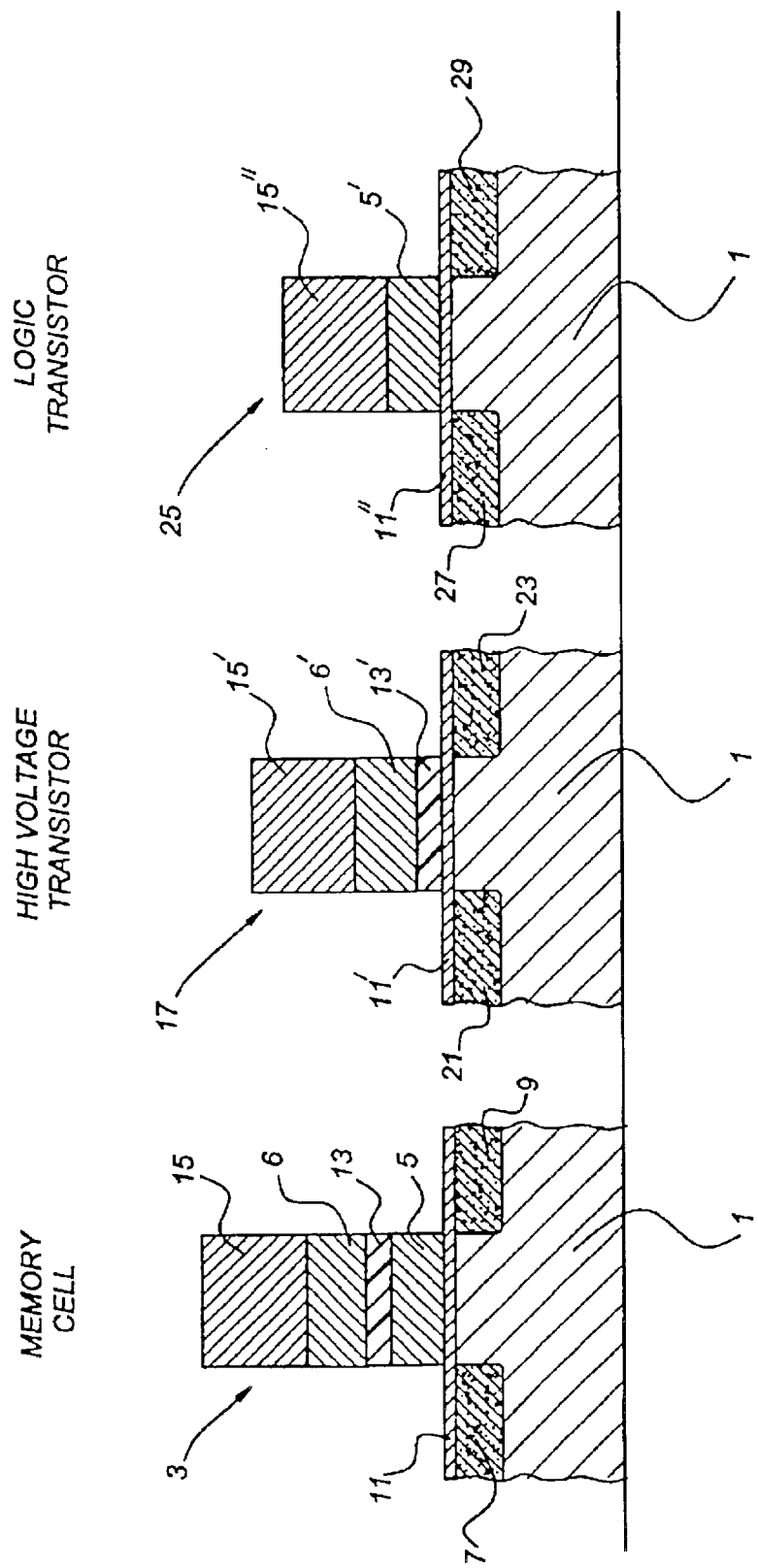
FIGS. 2 and 3 show alternative embodiments of the invention.

In a further embodiment, shown in FIG. 2, the high voltage transistor gate also comprises two layers 6' and 15'. As is further shown in FIG. 2, also the control gate of the memory cell 3 may comprise two layers 6, 15. By providing the additional layers 6 and 6' in a suitable thickness, the control gate thickness, high voltage transistor gate thickness and logic transistor gate thickness can be made equal. This simplifies the manufacturing process since these gates can then be patterned in the same etching step.

Figure 3:
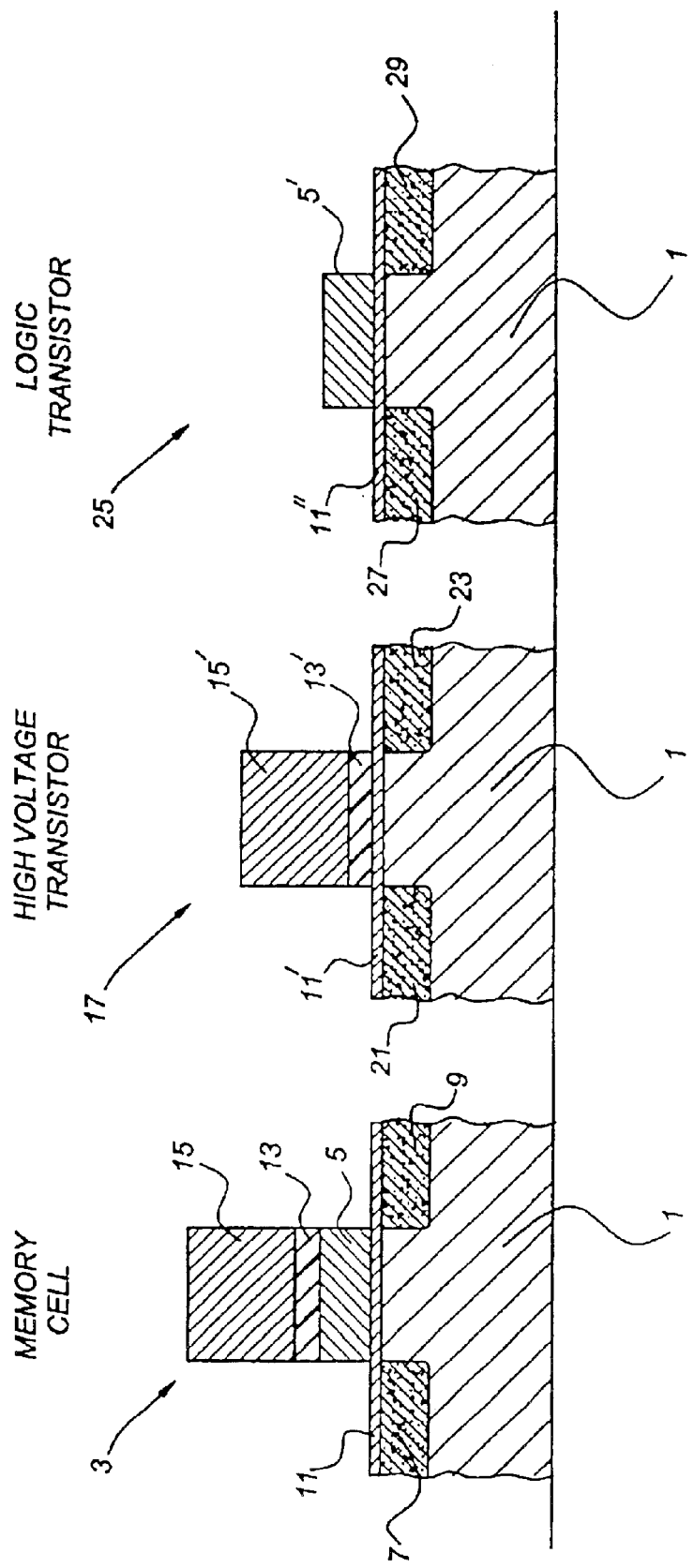

For completeness, FIG. 3 shows an embodiment in which the logic transistor gate comprises only one layer 5' that is made in the same manufacturing step as floating gate 5.

What is claimed is:

1. Semiconductor device comprising on a single substrate at least one memory cell, at least one high voltage transistor, and at least one logic transistor;

the at least one memory cell comprising a floating gate, a tunnel oxide layer between the floating gate and the substrate, a control gate, and a control oxide layer between the control gate and the floating gate;

the at least one high voltage transistor comprising a high voltage transistor gate and a high voltage transistor gate oxide between the high voltage transistor gate and the substrate, the high voltage transistor gate oxide comprising a first gate oxide layer on the substrate and a second gate oxide layer directly on top of the first gate oxide layer, wherein the second gate oxide layer and the control oxide layer of the memory cell have a same or substantially same predetermined thickness, the at least one logic transistor comprising a logic transistor gate and a logic transistor gate oxide between the logic transistor gate and the substrate, wherein the logic gate comprises a first gate layer on top of the logic transistor gate oxide and a second gate layer directly on top of said first gate layer, and wherein the first gate layer and the floating gate of the memory cell have a same or substantially predetermined thickness and a same or substantially same predetermined doping concentration, wherein the tunnel oxide layer of the memory cell, the first gate oxide layer of the high voltage transistor, and the logic transistor gate oxide have a same or substantially same predetermined first thickness.

2. Semiconductor device according to claim 1, wherein said first thickness is between 2 and 10 nm.

3. Semiconductor device according to claim 2, wherein said first thickness is between 4 and 8 nm.

4. Semiconductor device according to claim 1, wherein said floating gate has a doping concentration of less than $1\times10^{20}$ $cm^{-3}$, preferably less than $4\times10^{19}$ $cm^{-3}$.

5. Semiconductor device according to claim 1, wherein said second gate layer and said high voltage transistor gate have a same or substantially same predetermined fourth thickness.

6. Semiconductor device according to claim 5, wherein said high voltage transistor gate comprises a first high voltage transistor gate layer directly on top of the high voltage transistor gate oxide and a second high voltage transistor gate layer directly on top of the first high voltage transistor gate layer, the first high voltage transistor layer and the first gate layer having a same or substantially same predetermined fifth thickness.

7. Semiconductor device according to claim 6, wherein said control gate has a first control gate layer directly on top of the control oxide layer and a second control gate layer directly on top of the first control gate layer, said first control gate layer and the first gate layer having said same or substantially same predetermined fifth thickness.

* * * * *